United States Patent
Kempe

[11] Patent Number: 6,100,511
[45] Date of Patent: Aug. 8, 2000

[54] METHOD OF BONDING INSULATING WIRE AND DEVICE FOR CARRYING OUT THIS METHOD

[75] Inventor: Wolfgang Kempe, Mörfelden-Walldorf, Germany

[73] Assignees: Daimler-Benz Aktiengesellschaft, Stuttgart; AEG Identifikationssysteme GmbH, Ulm, both of Germany

[21] Appl. No.: 09/125,171

[22] PCT Filed: Feb. 10, 1997

[86] PCT No.: PCT/EP97/00596

§ 371 Date: Apr. 14, 1999

§ 102(e) Date: Apr. 14, 1999

[87] PCT Pub. No.: WO97/28922

PCT Pub. Date: Aug. 14, 1997

[30] Foreign Application Priority Data

Feb. 12, 1996 [DE] Germany ............ 196 05 038

[51] Int. Cl.⁷ .................................................. H05B 6/64
[52] U.S. Cl. .................. 219/679; 219/680; 219/58; 219/85.18; 228/179.1
[58] Field of Search ................................. 219/679, 680, 219/58, 56.1, 56.22, 56.21, 56, 85.18, 85.16, 85.1; 228/179.1, 4.5, 111, 111.5, 110.1, 10, 180.5

[56] References Cited

U.S. PATENT DOCUMENTS

| | | | |
|---|---|---|---|
| 4,527,730 | 7/1985 | Shirai et al. | 228/180.5 |
| 4,597,522 | 7/1986 | Kobayashi | 228/180.5 |

(List continued on next page.)

FOREIGN PATENT DOCUMENTS

| | | |
|---|---|---|
| 0106716A1 | 4/1984 | European Pat. Off. . |
| 0286031A2 | 10/1988 | European Pat. Off. . |
| 0421018A1 | 4/1991 | European Pat. Off. . |
| 2161023 | 7/1972 | Germany . |
| 250211A1 | 9/1992 | Germany . |
| 2-54947 | 2/1990 | Japan . |
| 2-112249 | 4/1990 | Japan . |
| 6-61313 | 3/1994 | Japan . |
| 6-181243 | 6/1994 | Japan . |
| 92/22827 | 12/1992 | WIPO . |
| 93/09551 | 5/1993 | WIPO . |

OTHER PUBLICATIONS

"Development of a Coated Bonding Technology", IEEE Transactions & Manufacturing Tech., 1989, Dec. #4, p.603–8.
"Ultrasonic Bonding of Insulated Wire" Welding Journal, Feb. 1978, p. 19–25.
Drawing: Westbond #CC–7215 Bonding Tool, Insulated Wire, May 11, 1993.
West Bond Equipment, Machine Specifications for Model 7400IW, Ultrasonic Wire Bonder, Apr. 15, 1992.
West Bond Brochure for Model 7400IW, Ultrasonic Insulated Wire Bonder, Jun. 1, 1992/.

*Primary Examiner*—Teresa Walberg
*Assistant Examiner*—Jeffrey C Pwu
*Attorney, Agent, or Firm*—Venable; Robert Kinberg; Eric J. Weierstall

[57] ABSTRACT

A method and device for electrically connecting enameled wire ends with contact surfaces. The enameled wire is stripped and pressed against the contact surface. The wire is charged with at least one of an electromagnetic and an acoustical energy. The enamel layer of the wire end is destroyed with the first energy in a first step. This is accomplished by charging the region with at least one of a first electromagnetic energy and a first acoustical energy. The enamel layer of the wire end is only partially destroyed in the first step through the pressing of a region of the wire end against the contact surface with a first pressing force. The wire is permanently connected to the contact surface with a second energy in a further step. The same region of the wire is pressed against the contact surface with a second, lower pressing force in the subsequent process step. It is charged with a second energy and connected to the contact surface so as to conduct electricity.

21 Claims, 2 Drawing Sheets

U.S. PATENT DOCUMENTS

| | | | |
|---|---|---|---|
| 4,619,397 | 10/1986 | Urban | 228/111 |
| 4,788,097 | 11/1988 | Hauser . | |
| 4,821,944 | 4/1989 | Tsumura . | |
| 4,950,866 | 8/1990 | Kojima et al. . | |
| 5,192,015 | 3/1993 | Ingle et al. . | |
| 5,240,166 | 8/1993 | Fontana, Jr. et al. . | |
| 5,298,715 | 3/1994 | Chalco et al. . | |
| 5,804,801 | 9/1998 | Lauf et al. | 219/759 |
| 5,938,952 | 8/1999 | Lin et al. | 219/121.64 |

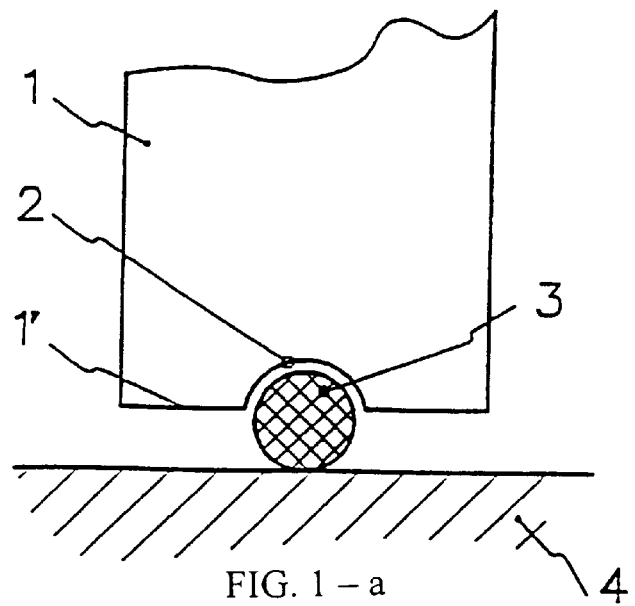
FIG. 1-a
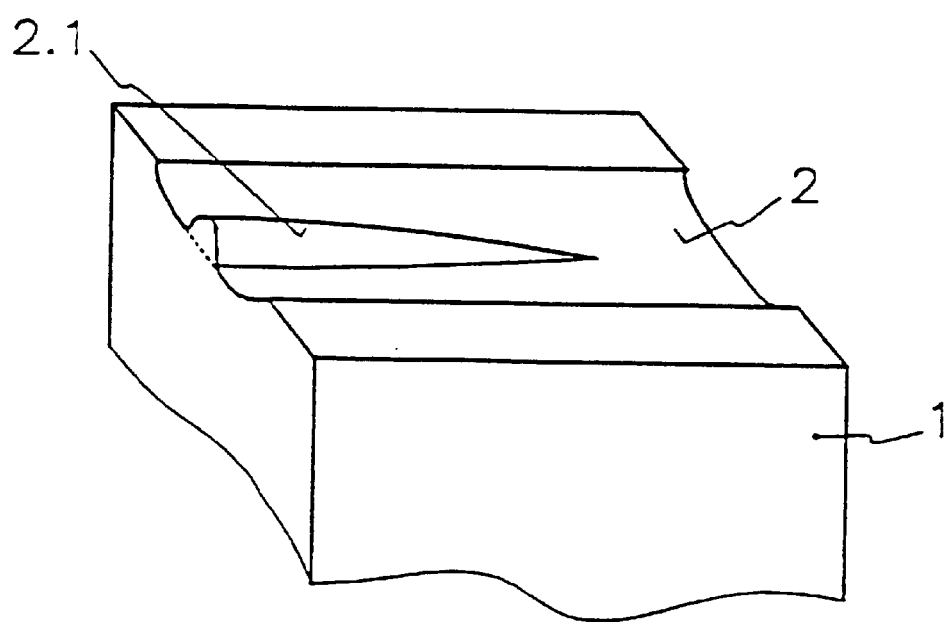
FIG. 1-b
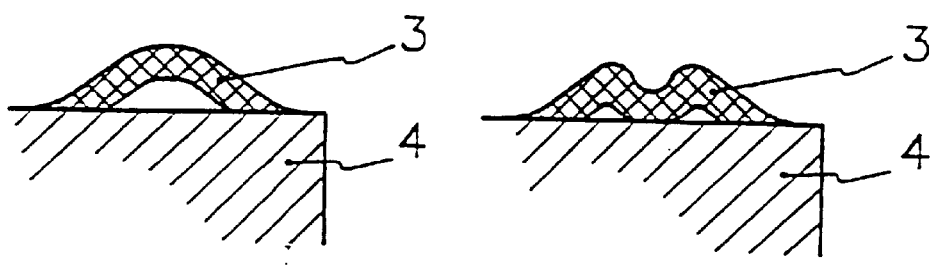
FIG. 1-c

METHOD OF BONDING INSULATING WIRE AND DEVICE FOR CARRYING OUT THIS METHOD

BACKGROUND OF THE INVENTION

The invention relates to a method of producing an electrically-conductive connection between enamelled wires, and a device for executing the method, as defined in the independent claims.

To produce identification systems, particularly transponders, transmitter/receiver units having logic circuits are coupled into integrated circuits (chips). The system is connected to the outside world by coils that operate in the radio-frequency range and are wound from thin copper wires insulated with a polyurethane-enamel covering. Typical wire diameters are about 10–50 μm. Methods such as thermocompression welding are used to connect electronic components of this type to semiconductor chips, in which case the ends of the copper wire are connected to the metallized chip contact surfaces. The wire is severely deformed in this method, however, so there is a risk of breakage. Prior to the electrical connection, an enamelled wire is first stripped, particularly by means of micro-mills or overheated soldering baths, then tin-coated and bonded to the chip contact surfaces. Conventional chip contact surfaces often comprise thin aluminum films, which undergo a so-called gold-bump method in an additional processing step for contacting the copper wires; this renders the aluminum surface solderable, and permits an adhesion between the different materials.

Transponders of this type are known from, for example, WO-A-93 09551. This publication discloses the connection of enamelled wires and chip contact surfaces in a laser-welding method. In this instance, the wire ends are heated with a laser beam prior to the connection, and the enamel is melted and vaporized. For reliable contacting, it is necessary to gold-plate and/or tin-coat the chip contact surfaces. It has also proven advantageous to tin-coat the wire ends as well. The wire is deformed only slightly or not at all, which can avoid breakage of the wire; however, the contact surface is consequently not utilized optimally. In addition, this method necessitates a number of complicated process steps. Finally, the electrical connection can be worsened by melted residual enamel remaining at the wire end, or vaporized residual enamel that contaminates the wire end.

A method of connecting enamelled wires through ultrasonic bonding is known from JP-A-2-112249. First, the wire end is stripped and bonded to the connecting surface with simultaneous ultrasound and heating. Stripping takes place on a surface that is adjacent to the connection surface and has a surface structure resembling a washboard. There, with ultrasound, the wire end is stripped as with a grater until the metal wire is visible, and is subsequently drawn across the actual connection surface. A similar method, from the same Applicant, is disclosed in JP-A-2-54947. While the disadvantage of contamination of the connection surface by carbonized residual enamel is avoided, the production of the frictional surfaces at each connection surface is technically highly complicated. Furthermore, the heat effect required in the method to produce a permanent electrical connection represents an undesirable stress on the component. The conventional methods consist of a series of technically-complicated, time-consuming and costly process steps that increase production costs.

JP-A-6-61313 discloses a bonding tool that is especially Supplemental Page 2a (insert between lines 23 and 24 of p. 2)

DE-A-21 61 023 discloses a bonding method in which wires are bonded to contact surfaces with ultrasound. In the process, the wire is first fixed to the contact surface with an ultrasonic prepulse, and then welded to the contact surface with a more intense pulse. At this point, the wire is severely deformed; its thickness in the processed region is only about 30% of the original diameter. An arbitrary oxide layer or an insulating coating of the wire is broken open on both the top side and the contact side. The top side of the wire is unprotected, and insulation residue can remain on the contact surface. The enamel layer is preferably broken open on the underside of the wire, which is intended to come into contact with the connection surface, without damage to the enamel layer on the top side of the wire.

In a particularly-preferred embodiment of the method, both process steps are executed with ultrasound.

The advantage of the method is that a reliable contacting is attained without necessitating a prior process step of separate stripping and tin-coating of the wire end or a costly gold-plating or gold-bump method for the chip contact surfaces. In contrast to methods in which the enamel layer is removed all around the wire, only the enamel layer on the underside is removed. The remaining enamel layer can provide the electrical connection with long-term protection against corrosion without worsening the connection itself.

It is further advantageous that the stress in the connection region between the wire and contact surface is greatly reduced because, on the one hand, heating is no longer necessary in ultrasonic bonding and, on the other hand, the wire deformation is sufficient for an optimum contact resistance, but is small enough to prevent wire breakage.

The method is executed in two stages at the same wire end, and essentially at the same location on the connection surface. The ultrasonic tool requires no costly displacement unit for displacing the wire end during the connection process.

The method can be executed with conventional bonding machines that are modified to a small extent. It is advantageous to use a special bonding tool that has a simple design and can be used in conventional bonding machines, because the conventional bonding tool is not suitable for guiding loose wire ends from components.

In a preferred embodiment, the bonding tool is embodied so as to support the detachment of the enamel insulation on the wire underside, which is intended to produce the electrical contact, without damaging the enamel surface on the top side of the wire and, simultaneously, the tool advantageously deforms the wire such that an optimum wire surface can come into contact with the electrical contact surface.

In the first process step, a molten ball is successfully formed at the wire end, despite the enamel insulation of the wire, for producing a so-called "ball-wedge" contact. The permanent connection is effected in the second process step.

The features essential to the invention are listed in detail below and described at length with reference to figures. Shown are in:

BRIEF DESCRIPTION OF THE DRAWINGS

FIG. 1a a bonding tool for a wedge-wedge bonding device;

FIG. 1b a view of the underside of the bonding tool;

FIG. 1c a section through two connections;

DETAILED DESCRIPTION OF THE DRAWINGS

Figure 2:
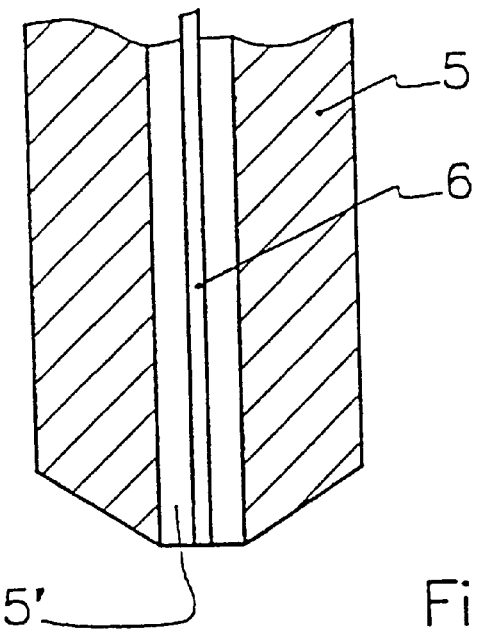
FIG. 2 a bonding capillary, particularly for ball-wedge bonding devices.
Figure 3:
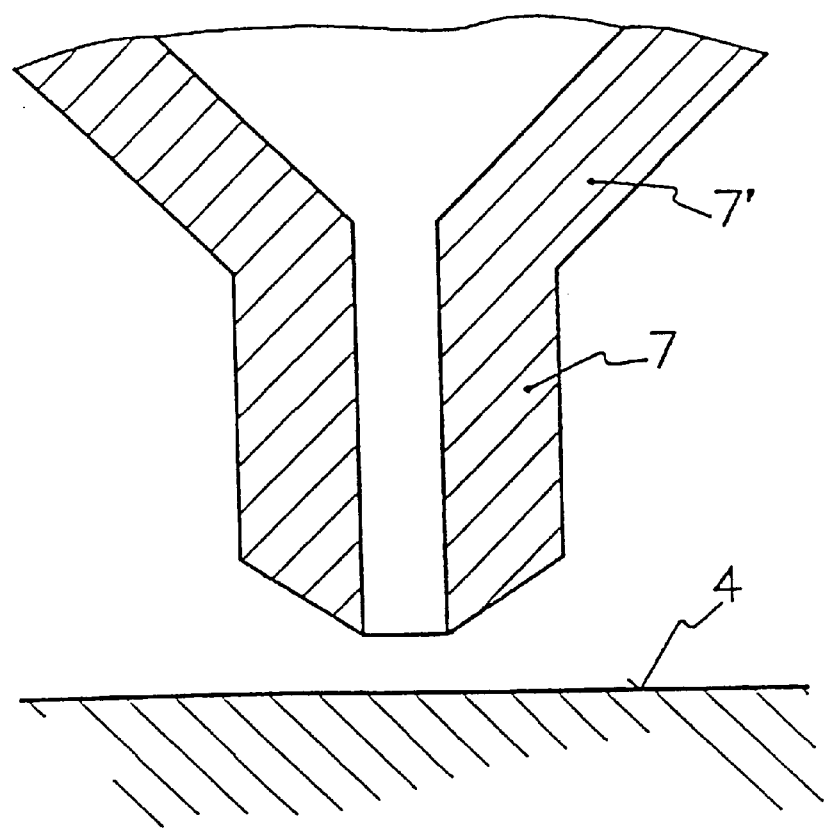
FIG. 3 a bonding capillary with a threading aid, particularly for ball-wedge bonding devices.

To produce an electrical contact between components, for example coils and other wound elements, and a semiconductor chip, first the insulation of the protective enamel layer, which is intended to prevent any winding shorts in the component, must be opened.

This can be effected by means of electromagnetic energy such as heat, microwaves—preferably with an aqueous enamel—or acoustical energy, such as ultrasound, with a frequency above 50 kHz. At least a portion of the radiated energy is absorbed into the enamel layer and destroys the enamel or, if heat is applied, the enamel is burned locally.

A so-called wedge-wedge bonding method is described below. In a preferred embodiment, the method is executed with ultrasound.

Conventional ultrasound powers in ultrasonic bonding according to the state of the technology are about 2 Watts, while conventional pressing forces are between about 0.2–0.3 N.

In a first process step of the invention, a first ultrasound power, which is higher than the power used in conventional ultrasonic bonding, is used to break open the enamel layer. The wire is also pressed with a first pressing force onto the electrical contact surface. The first pressing force can preferably vary from zero to a value higher than those used conventionally. The first ultrasound power exceeds the conventional power of about 2 Watts by at least 20%; it is particularly preferably between 4 and 5 Watts.

The first pressing force is preferably higher, preferably by about one order of magnitude, than the conventional pressing force of 0.2–0.3 N during bonding; it is preferably more than 1 N. The protective enamel layer on the wire underside is so severely damaged that the metal wire becomes visible. The remainder of the opened enamel layer is reliably pushed to the flanks of the wire piece to be bonded. If need be, the residual enamel can be removed, preferably through suction.

In a second, directly-consecutive process step, the wire end is pressed against the contact surface with a second pressing force, preferably a lower pressing force than in the first step. The pressing force must be large enough, however, to overcome the mechanical resistance due to the residual enamel now located at the flanks of the wire piece. For conventional wire thicknesses of an approximately 50-$\mu$m diameter, the second pressing force is preferably in a range between 0.1 and 5 N, particularly preferably between 0.5 and 1.5 N. It is useful to optimize the second pressing force for other wire thicknesses. The ultrasound power and the pressing forces act on the same region of the wire end and the same region of the contact surface in the first and second process steps.

The ultrasound powers and the pressing forces are significantly higher overall than in conventional ultrasonic bonding methods, but remain low enough in the two process steps that they do not damage the chip contact surface. While the underside of the enamel layer facing the contact surface is reliably opened and removed, the top side of the enamel layer, in contrast, remains basically intact and protects the connection against corrosion.

Following these two process steps, the electrical connection is permanently formed between the component, particularly a coil, and the chip contact surface. The holding forces between the wire and the contact surface are comparable to those in conventional cold-welded connections. The stress on the connecting region between the wire end and the contact surface, as well as the deformation of the wire end, are, however, considerably less than in a thermocompression method.

The method can be executed with simple changes to the bonding machines, and is preferably executed with bonding machines that make available ultrasound powers and pressing forces up to the desired level of preferably about 10 W and 5 N.

It is particularly advantageous that the bonding tool can be simplified, as shown in FIG. 1. Instead of the conventional, costly construction with an inclined, through-going bore of the approximately-cylindrical tool, typically at an angle between 30° and 60°, and a wire diversion that leads a bonding wire that has been inserted into the bore parallel to the contact surface on the tool underside, a simpler bonding tool 1 is used, whose underside 1' has an oblong, concave notch 2 that is adapted to the wire diameter (FIG. 1*a*). The notch 2 is preferably shaped like a sectioned cylinder, with the wire 3 being guided parallel to the notch's center axis. The depth of the notch is less than the respective wire diameter.

It is particularly advantageous that the bonding tool 1 operates in the horizontal direction, and a complicated threading procedure of the wire ends 3, which are not guided, for example of a coil, is omitted; despite this, the wire ends 3 are reliably guided during bonding and pressed against the contact surface 4.

In a particularly-preferred embodiment, the bonding tool 1 is shaped so as to support the opening and removal of the enamel layer on the wire underside, which is supposed to produce the electrical contact, without damaging the enamel layer at the top side of the wire. At the same time, the wire is advantageously deformed such that the largest possible wire surface can come into contact with the electrical contact surface without the risk of severe deformation of the wire that leads to breakage. This is illustrated in FIG. 1*b*. A protrusion 2.1, which faces the wire end, is located along the apex line of the concave notch 2. The height of the protrusion 2.1 is less than that of the Page 7 notch 2. The protrusion is oblong and extends along the apex line of the notch 2. The protrusion preferably ends in a point.

FIG. 1*c* shows a schematic comparison between two typical sectional images of bonded wire ends, which are produced with the known tool and the tool of the invention, respectively. The wire end 3 bonded with the known tool is essentially connected to the contact surface 4 in the edge region. The inner region of the wire end 3 is not in contact with the contact surface 4. In contrast, the wire end 3 bonded with the tool of the invention is in contact with the contact surface 4 in both the edge region and the inner region. The protrusion 2.1 impresses a cavity into the surface of the wire end. During the bonding process, the additional pressure of the protrusion on the wire apex supports the breaking open of the enamel layer on the wire underside and the removal of the residual enamel to the wire edge. Only small surface regions near the cavity flanks are not in contact with the contact surface 4.

A further variation of the method of the invention involves a ball-wedge bonding method. In the conventional ball-wedge method, a wire end that has been inserted into a bonding capillary is melted by means of a spark discharge. The resulting molten ball is bonded to the desired contact surface with ultrasound. This method, however, requires an uninterrupted conductive connection with the wire, and therefore cannot be executed with enamelled wires.

The insulation of the wire end can also be destroyed by the effect of thermal energy in the first process step. The first pressing force is omitted in the first process step. The wire is inserted into a special bonding capillary 5 having an inside diameter 5' and lateral slots (FIG. 2). The slot width is only slightly greater than the wire diameter. After the wire has been inserted, the slot 6 can be closed in order to hold the wire securely. This is effected, for example, with the aid of a sleeve that is pushed over the capillary 5, or by means of a slotted ring that is already positioned on the capillary 5 when the wire is inserted, with the slot in the ring being at least as wide as the slot in the capillary 5. After the wire has been inserted, the ring is rotated such that the slot 6 is closed by the ring in the capillary 5. The ring and the sleeve are not shown in FIG.

What is claimed is:

1. A method of electrically connecting enameled wire ends with contact surfaces, with an enameled wire end being stripped and pressed against a contact surface and the wire being charged with at least one of an electromagnetic energy and an acoustical energy, wherein the enamel layer of the wire end is destroyed with a first energy in a first process step, and the wire is permanently connected to the contact surface with a second energy in a second process step, so that the enamel layer of the wire end is only partially destroyed in the first process step through the pressing of a region of the wire end against the contact surface with a first pressing force, and the charging of the region with at least one of a first electromagnetic energy and a first acoustical energy, and the same region of the wire end is pressed against the contact surface with a second, lower pressing force in a subsequent second process step, and is charged with the second energy and connected to this contact surface so as to conduct electricity.

2. The method according to claim 1, characterized in that the first pressing force is greater than 1 N.

3. The method according to claim 1, characterized in that the second pressing force is between 0.1 and 5 N.

4. The method according claim 1, chararacterized in that the second pressing force is between 0.5 and 1.5 N.

5. The method according claim 1, wherein the wire end is charged with ultrasound of a frequency above 50 kHz.

6. The method according to claim 1, wherein the first ultrasound power in the first process step is higher than 2.4 Watts.

7. The method according to claim 1, wherein the first ultrasound power in the first process step is higher than 3.9 Watts.

8. The method according to claim 1, wherein the first ultrasound power in the first process step is no higher than 10 Watts.

9. The method according to claim 1, wherein the wire end is charged with a second ultrasound power between 1 and 5 Watts in the second process step.

10. The method according to claim 1, wherein the wire end is charged with thermal energy in the first process step.

11. The method according to claim 1, wherein the wire end is charged with microwave energy in the first process step.

12. A device for electrically connecting enameled wire ends and contact surfaces comprising:

at least one of an acoustical source and an electromagnetic energy source that radiates energy in the direction of a wire end;

a bonding tool to which the wire end is supplied for connection, the bonding tool being provided on the underside, facing the contact surface with a concave, oblong notch, the depth of the notch at the underside of the bonding tool being less than the diameter of the wire end; and an essentially oblong, convex protrusion that faces the wire end in the notch at the notch's apex region.

13. The device according to claim 12, wherein the height of the protrusion (2.1) is less than the depth of the notch (2).

14. The device according to claim 12, wherein the wire end is guided in a bonding capillary (5, 7) during charging with thermal energy in the first process step.

15. The device according to claim 12, wherein the bonding capillary (5) is provided with a lateral slot along the longitudinal axis of the capillary.

16. The device according to claim 15, wherein the width of the vertical slot is at most 50% larger than the diameter of the wire end.

17. The device according to claim 15, wherein the bonding capillary (7) is provided with a funnel-shaped extension (7') on the side facing away from the contact surface.

18. The device according to claim 13, wherein a pressing force between the wire end and the contact surface can be adjusted.

19. The device according to claim 18, wherein the pressing force between the wire end and the contact surface can be selected to be up to 5 N.

20. The device according to claim 13, wherein an energy source of the device is an ultrasound source.

21. The device according to claim 20, wherein the power of the ultrasound source can be selected to be between 0 and 10 Watts.

* * * * *